(12) United States Patent
Hao et al.

(10) Patent No.: US 12,154,968 B2
(45) Date of Patent: Nov. 26, 2024

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Ronghui Hao, Suzhou (CN); Chuan He, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 712 days.

(21) Appl. No.: 17/417,122

(22) PCT Filed: Feb. 25, 2021

(86) PCT No.: PCT/CN2021/077943
§ 371 (c)(1),
(2) Date: Jun. 22, 2021

(87) PCT Pub. No.: WO2022/178773
PCT Pub. Date: Sep. 1, 2022

(65) Prior Publication Data
US 2023/0075628 A1 Mar. 9, 2023

(51) Int. Cl.
*H01L 29/66* (2006.01)
*H01L 29/20* (2006.01)
(Continued)

(52) U.S. Cl.
CPC ...... *H01L 29/66462* (2013.01); *H01L 29/404* (2013.01); *H01L 29/7786* (2013.01); *H01L 29/2003* (2013.01)

(58) Field of Classification Search
CPC ............. H01L 29/66462; H01L 29/778; H01L 29/7786; H01L 29/7787
See application file for complete search history.

(56) References Cited

U.S. PATENT DOCUMENTS

2012/0274402 A1\* 11/2012 Kocon ................. H01L 29/402
330/277
2013/0313611 A1 11/2013 Khalil et al.
(Continued)

FOREIGN PATENT DOCUMENTS

| CN | 1716618 A | 1/2006 |
| CN | 103489897 A | 1/2014 |

(Continued)

OTHER PUBLICATIONS

First Office Action of the corresponding China patent application No. 202180000972.9 mailed on Dec. 29, 2021.
(Continued)

*Primary Examiner* — Robert G Bachner
*Assistant Examiner* — Molly K Reida
(74) *Attorney, Agent, or Firm* — JCIPRNET

(57) ABSTRACT

A nitride-based semiconductor device includes a first nitride-based semiconductor layer, a second nitride-based semiconductor layer, a source electrode, a drain electrode, a gate electrode a first strain-compensating layer, and a first protection layer. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate electrode is disposed between the source and drain electrodes. The first strain-compensating layer is disposed above the second nitride-based semiconductor layer and between the drain and gate electrodes. The first protection layer covers the first strain-compensating layer to form a first interface, in which a vertical distance between the first interface and the second nitride-based semiconductor layer increases along a direc- (Continued)

tion pointing toward the drain electrode from the gate electrode.

15 Claims, 14 Drawing Sheets

(51) Int. Cl.
*H01L 29/40* (2006.01)
*H01L 29/778* (2006.01)

(56) References Cited

U.S. PATENT DOCUMENTS

| | | | | |
|---|---|---|---|---|
| 2013/0313612 | A1* | 11/2013 | Khalil | ........... H01L 29/7848 |
| | | | | 257/E29.252 |
| 2014/0159116 | A1 | 6/2014 | Briere et al. | |
| 2016/0190297 | A1* | 6/2016 | Kudymov | ........... H01L 29/2003 |
| | | | | 257/76 |
| 2017/0077278 | A1 | 3/2017 | Simin et al. | |
| 2017/0077282 | A1 | 3/2017 | Lee et al. | |
| 2021/0043724 | A1 | 2/2021 | Wu et al. | |

FOREIGN PATENT DOCUMENTS

| | | |
|---|---|---|
| CN | 104979361 A | 10/2015 |
| CN | 104979404 A | 10/2015 |
| CN | 105244376 A | 1/2016 |
| CN | 205264712 U | 5/2016 |
| CN | 105720096 A | 6/2016 |
| CN | 106024716 A | 10/2016 |

OTHER PUBLICATIONS

International Search Report and Written Opinion of the corresponding PCT application No. PCT/CN2021/077943 mailed on Jun. 25, 2021.

Second Office Action of the corresponding China patent application No. 202180000972.9 mailed on Apr. 6, 2022.

* cited by examiner

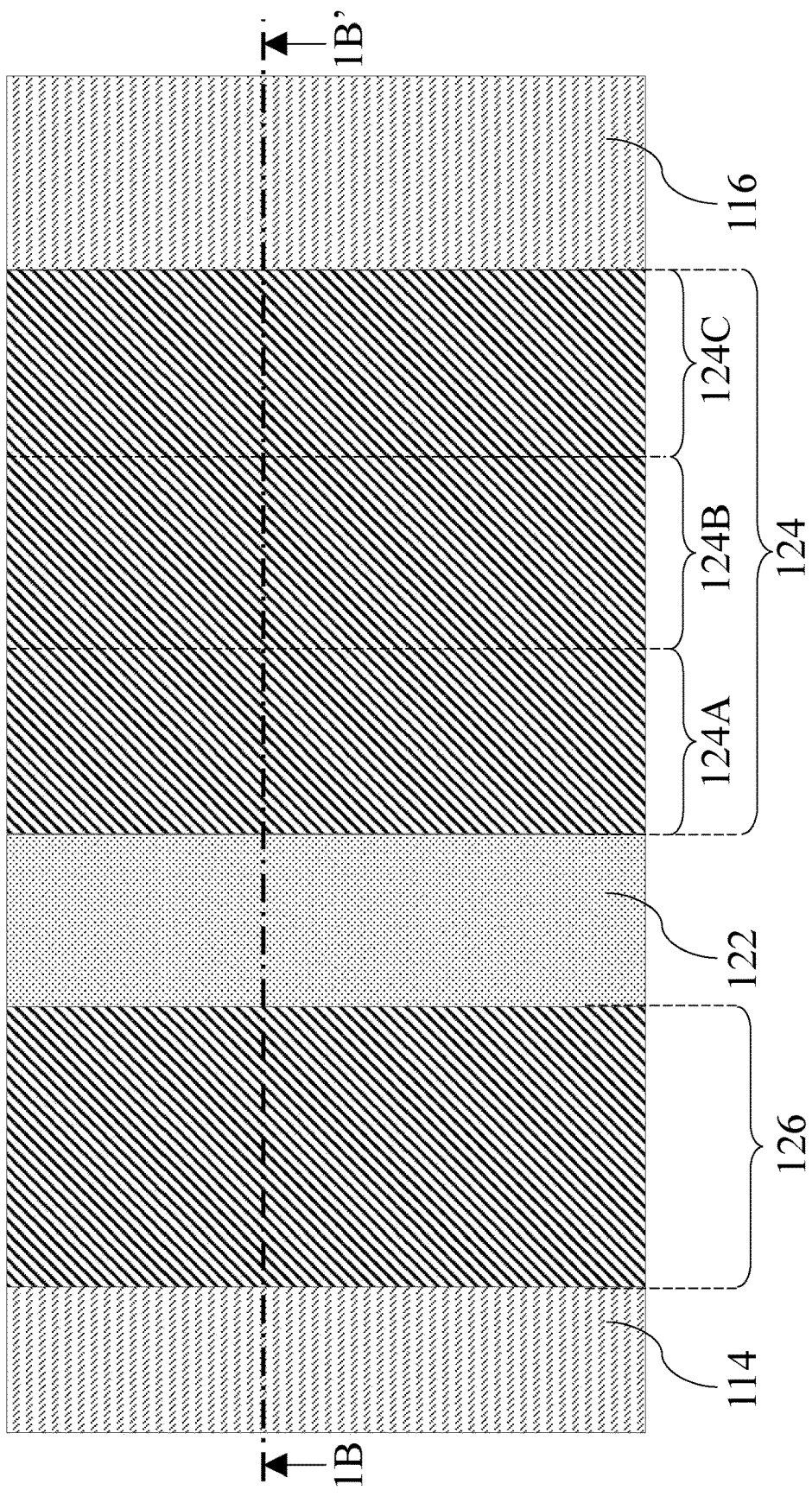

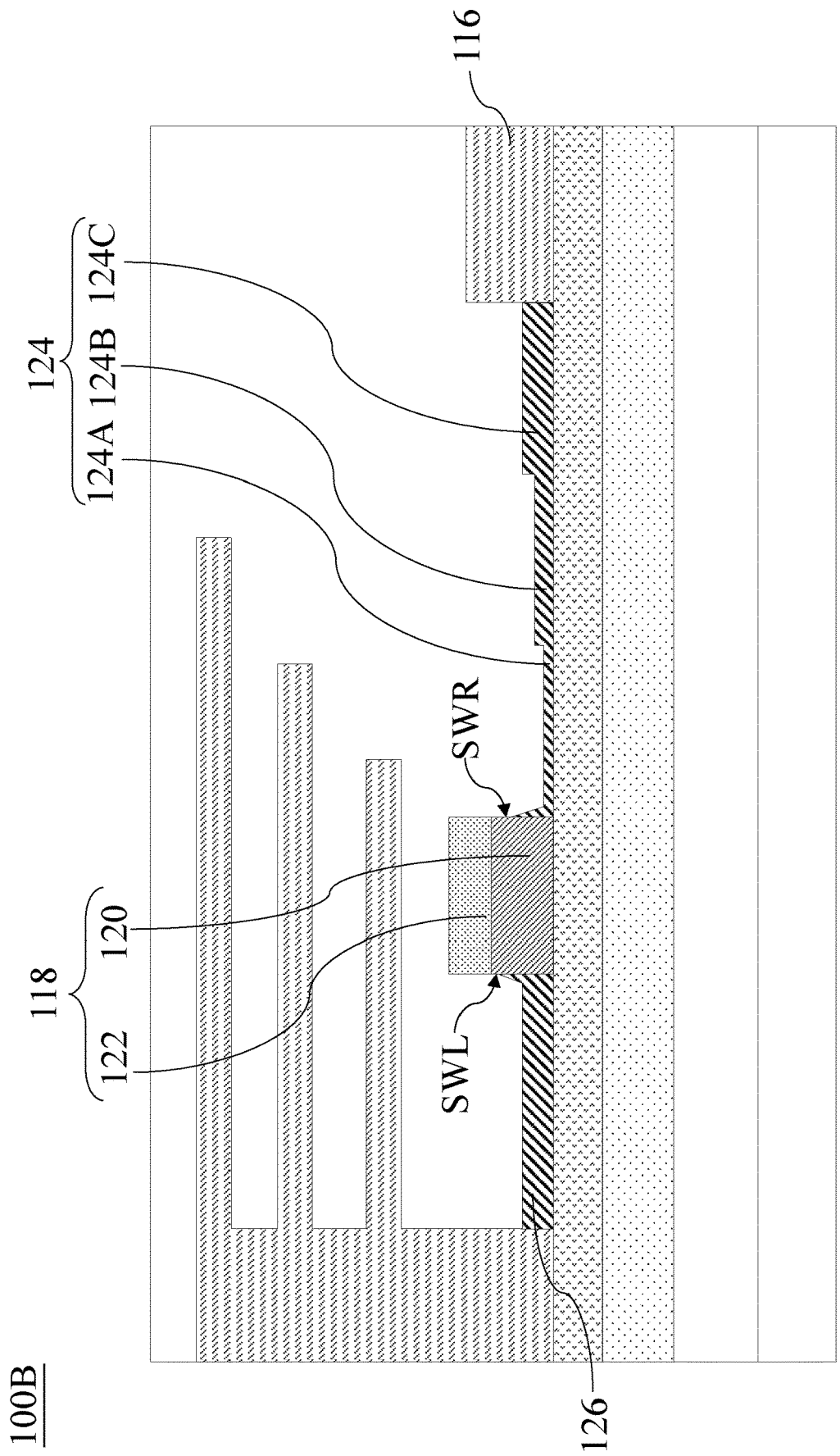

SEMICONDUCTOR DEVICE AND METHOD FOR MANUFACTURING THE SAME

FIELD OF THE INVENTION

The present invention generally relates to a semiconductor device. More specifically, the present invention relates to a high electron mobility transistor (HEMT) semiconductor device having a strain-compensating layer with a varying thickness for improving the performance of the HEMT.

BACKGROUND OF THE INVENTION

In recent years, intense research on high-electron-mobility transistors (HEMTs) has been prevalent, particularly for high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a source electrode, a drain electrode, a gate electrode a first strain-compensating layer, and a first protection layer. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes. The first strain-compensating layer is disposed above the second nitride-based semiconductor layer and between the drain and gate electrodes. The first protection layer covers the first strain-compensating layer to form a first interface, in which a vertical distance between the first interface and the second nitride-based semiconductor layer increases along a direction pointing toward the drain electrode from the gate electrode.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A pair of source and drain electrodes are formed over the second nitride-based semiconductor layer. A gate electrode is formed over the second nitride-based semiconductor layer and between the source and drain electrodes. A strain-compensating layer is formed over the second nitride-based semiconductor layer and at least between the gate electrode and the drain electrode. A thickness of the strain-compensating layer between the gate electrode and the drain electrode is reduced such that the thickness of the strain-compensating layer is nonuniform. A passivation layer is formed to cover the strain-compensating layer having the nonuniform thickness.

In accordance with one aspect of the present disclosure, a nitride-based semiconductor device is provided. The nitride-based semiconductor device includes a first nitride-based semiconductor layer, a second nitride-based semiconductor layer, a source electrode, a drain electrode, a gate structure, a first strain-compensating layer, and a second strain-compensating layer. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate structure is disposed above the second nitride-based semiconductor layer and between the source and drain electrodes, in which the gate structure includes a doped III-V compound semiconductor layer and a gate electrode stacked on the doped III-V compound semiconductor layer. The first strain-compensating layer is disposed above the second nitride-based semiconductor layer and in contact with a first sidewall of the doped III-V compound semiconductor layer. The second strain-compensating layer is disposed above the second nitride-based semiconductor layer and in contact with a second sidewall of the doped III-V compound semiconductor layer. A contact region between the first strain-compensating layer and the first sidewall is in a position lower than a contact region between the second strain-compensating layer and the second sidewall.

By applying the above configuration, since the first strain-compensating layer can have varying thickness, such that a two-dimensional electron gas (2DEG) region under the first strain-compensating layer can have gradually increasing 2DEG density, so as to cure the breakdown and hot electron issues, improving the performance of the GaN-based HEMT device.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 1A is a top view of a semiconductor device according to some embodiments of the present disclosure;

FIG. 4 is a cross-sectional view of a semiconductor device according to some embodiments of the present disclosure;

DETAILED DESCRIPTION

Figure 1B:
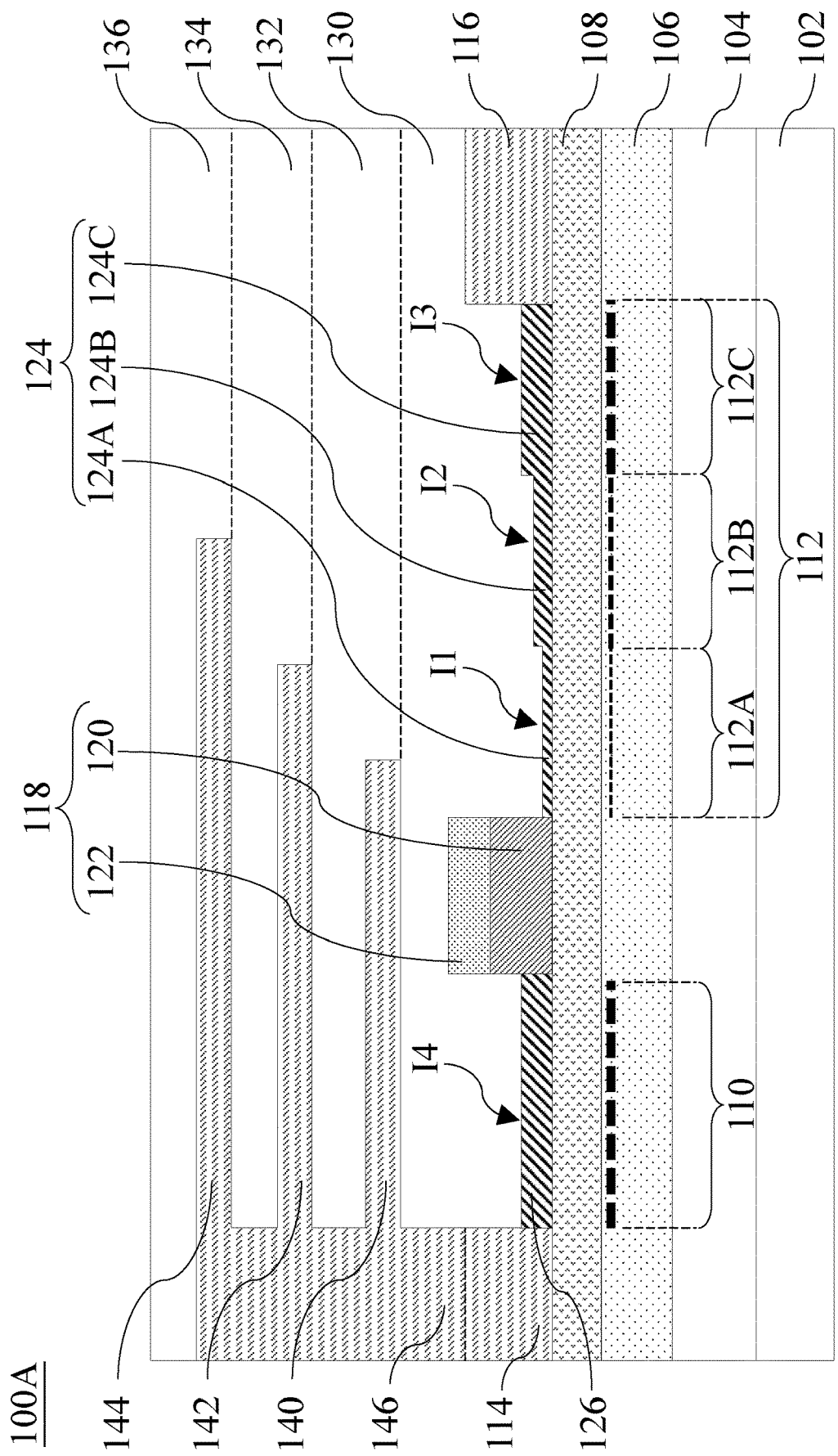
FIG. 1B is a cross-sectional view across a line 1B-1B' of the semiconductor device in FIG. 1A.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a top view of a semiconductor device 100A according to some embodiments of the present disclosure. The top view shows a relationship among source/drain (S/D) electrodes 114 and 116, a gate electrode 122, and strain-compensating layers 124 and 126 of the semiconductor device 100A. These elements can constitute parts of at least one transistor in the semiconductor device 100A. Herein, the top views means that the S/D electrodes 114 and 116, the gate electrode 122, and the strain-compensating layers 124 and 126 are formed as layers and viewed along a direction normal to these layers. The gate electrode 122 is disposed between the S/D electrodes 114 and 116. The strain-compensating layer 124 is disposed between the S/D electrode 116 and the gate electrode 122. The strain-compensating layer 126 is disposed between the S/D electrode 114 and the gate electrode 122. The strain-compensating layer 124 can have three portions 124A, 124B, and 124C arranged along a direction pointing from the gate electrode 122 toward the S/D electrode 116. The portion 124B is located between the portion 124A and 124C. The portions 124A, 124B, and 124C may have different thicknesses, which will be advantageous to improvement of the performance of the semiconductor device 100A. The further explanation regarding the improvement and more structural details of the semiconductor device 100A are provided as follows.

FIG. 1B is a cross-sectional view across a line 1B-1B' of the semiconductor device 100A in FIG. 1A. The semiconductor device 100A further includes a substrate 102, a buffer layer 104, nitride-based semiconductor layers 106 and 108, gate structures 118, a protection layer 130, passivation layers 132, 134, and 136, and field plates 140, 142, and 144.

The substrate 102 may be a semiconductor substrate or another substrate material. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 104 can be disposed above the substrate 102. The buffer layer 104 can be configured to reduce lattice and thermal mismatches between the substrate 102 and a layer formed to be formed over the substrate 102 (e.g., the nitride-based semiconductor layer 106), thereby reducing defects due to the mismatches/difference. The buffer layer 104 may include a III-V compound. The III-V compound can include, for example but are not limited to, aluminum, gallium, indium, nitrogen, or combinations thereof. Accordingly, the exemplary materials of the buffer layer 104 can further include, for example but are not limited to, GaN, AlN, AlGaN, InAlGaN, or combinations thereof.

In some embodiments, the semiconductor device 100A may further include a nucleation layer (not illustrated). The nucleation layer may be formed between the substrate 102 and the buffer layer 104. The nucleation layer can be configured to provide a transition to accommodate a mismatch/difference between the substrate 102 and a III-nitride layer of the buffer layer 104. The exemplary material of the nucleation layer can include, for example but is not limited to AlN or any of its alloys.

The nitride-based semiconductor layer 106 is disposed over the buffer layer 104. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The nitride-based semiconductor layer 108 is disposed on the nitride-based semiconductor layer 106. The exemplary materials of the nitride-based semiconductor layer 108 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 106 and 108 are selected such that the nitride-based semiconductor layer 108 has a bandgap (i.e., forbidden band width) greater than a bandgap of the nitride-based semiconductor layer 106, which causes electron affinities thereof different from each other and forms a heterojunction therebetween. For example, when the nitride-based semiconductor layer 106 is an undoped GaN layer having bandgap of approximately 3.4 eV, the nitride-based semiconductor layer 108 can be selected as an AlGaN layer having bandgap of approximately 4.0 eV. As such, the nitride-based semiconductor layers 106 and 108 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region 110 or 112 adjacent to the heterojunction. Accordingly, the semiconductor device 100A is available to include at least one GaN-based high-electron-mobility transistor (HEMT).

The gate structure 118 can be disposed on/over/above the nitride-based semiconductor layer 108. Each of the gate structure 118 includes a p-type doped III-V compound semiconductor layer 120 and the gate electrode 122 which is mentioned in FIG. 1A. The p-type doped III-V compound semiconductor layer 122 and the gate electrode 122 are stacked on the nitride-based semiconductor layer 108. The p-type doped III-V compound semiconductor layer 120 is between the nitride-based semiconductor layer 108 and the gate electrode 122. In some embodiments, the gate structure 118 may further include an optional dielectric layer (not illustrated) stacked on/over/above the nitride-based semiconductor layer 108.

In the exemplary illustration of FIG. 1B, the semiconductor device 100A is an enhancement mode device, which is in a normally-off state when the gate electrode 122 are at approximately zero bias. Specifically, the p-type doped III-V compound semiconductor layer 120 may create at least one p-n junction with the nitride-based semiconductor layer 108 to deplete the 2DEG region, such that at least one zone of the 2DEG region corresponding to a position below the corresponding gate structure 118 (e.g., a 2DEG region between the 2DEG regions 110 and 112) has different characteristics (e.g. different electron concentrations) than the rest of the 2DEG region (e.g., the 2DEG regions 110 and 112) and thus is blocked. Due to such mechanism, the semiconductor device 100A has a normally-off characteristic. In other words, when no voltage is applied to the gate electrodes 114 or a voltage applied to the gate electrodes 114 is less than a threshold voltage (i.e., a minimum voltage required to form an inversion layer below the gate structure 118), the zone of the 2DEG region (e.g., a 2DEG region between the 2DEG regions 110 and 112) below the gate structure 118 is kept blocked, and thus no current flows therethrough. Moreover, by providing the p-type doped III-V compound semiconductor layer 120, gate leakage current is reduced and an increase in the threshold voltage during the off-state is achieved.

In some embodiments, the p-type doped III-V compound semiconductor layer 120 can be omitted, such that the semiconductor device 100A is a depletion-mode device, which means the semiconductor device 100A in a normally-on state at zero gate-source voltage.

The exemplary materials of the p-type doped III-V compound semiconductor layer 120 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as B, Be, Mg, Zn, and Cd. In some embodiments, the nitride-based semiconductor layer 106 includes undoped GaN and the nitride-based semiconductor layer 108 includes AlGaN, and the p-type doped III-V compound semiconductor layer 122 are p-type GaN layers which can bend the underlying band structure upwards and to deplete the corresponding zone of the 2DEG region (e.g., a 2DEG region between the 2DEG regions 110 and 112), so as to place the semiconductor device 100A into an off-state condition. In some embodiments, the gate electrode 122 may include metals or metal compounds. The gate electrode 122 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrode 122 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

The S/D electrodes 114 and 116 can be disposed on/over/above the nitride-based semiconductor layer 108. The term "S/D electrode" means each of the S/D electrodes 114 and 116 can serve as a source electrode or a drain electrode, depending on the device design. The S/D electrodes 114 and 116 can be located at two opposite sides of the gate structure 118 although other configurations may be used, particularly when plural source, drain, or gate electrodes are employed in the device. The gate structure 118 can be arranged such that the gate structure 118 is located between the S/D electrodes 114 and 116. The gate structure 118 and the S/D electrodes 114 and 116 can collectively act as a nitride-based/GaN-based HEMT with the 2DEG regions 110 and 112, which can be called a nitride-based/GaN-based semiconductor device as well. In the exemplary illustration of FIG. 1B, the pair of the S/D electrodes 114 and 116 are asymmetrical about the gate structure 118 therebetween, in which the S/D electrode 114 is closer to the gate structure 118 than the S/D electrode 116. In some embodiments, the S/D electrode 116 is closer to the gate structure 118 than the S/D electrode 114. In other embodiments, the pair of the S/D electrodes 114 and 116 are symmetrical about the gate structure 118 therebetween.

In some embodiments, each of the S/D electrodes 114 and 116 can include, for example but are not limited to, metals, alloys, doped semiconductor materials (such as doped crystalline silicon), compounds such as silicides and nitrides, other conductor materials, or combinations thereof. The exemplary materials of each of the S/D electrodes 114 and 116 can include, for example but are not limited to, Ti, AlSi, TiN, or combinations thereof. Each of the S/D electrodes 114 and 116 may be a single layer, or plural layers of the same or different composition. In some embodiments, the S/D electrodes 114 and 116 form ohmic contact with the nitride-based semiconductor layer 108. The ohmic contact can be achieved by applying Ti, Al, or other suitable materials to the S/D electrodes 114 and 116. In some embodiments, each of the S/D electrodes 114 and 116 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The strain-compensating layer 124 can be disposed on/over/above the nitride-based semiconductor layer 108. The strain-compensating layer 124 is located between the gate electrode 122 of the gate structure 118 and the S/D electrode 116. The strain-compensating layer 124 covers the nitride-based semiconductor layer 108, so as to contact a top surface of the nitride-based semiconductor layer 108. Considering the formation quality of the strain-compensating layer 124, the exemplary materials of each of the strain-compensating layer 124 can include, for example but are not limited to, aluminum, nitrogen, or combinations thereof. For example, the strain-compensating layer 124 can be formed as an AlN layer to match the property of the nitride-based semiconductor layer 108 (e.g., match on lattice constant).

The strain-compensating layer 124 has portions 124A, 124B, and 124C. The portions 124A, 124B, and 124C of the strain-compensating layer 124 are arranged along the direction pointing from the gate electrode 122 toward the S/D electrode 116. The portion 124A is located between the gate electrode 122 and the portion 124B. The portion 124B is located between the portions 124A and 124C. The portion 124B may connect the portion 124A to portion 124C. The portion 124C is located between the portion 124B and the S/D electrode 116.

The portion 124A can make contact with the gate structure 118. The portion 124A can make contact with the p-type doped III-V compound semiconductor layer 120 of the gate structure 118. The portion 124A may have a top surface in a position lower than an interface between the p-type doped III-V compound semiconductor layer 120 and the gate electrode 122. In some embodiments, the portion 124A can further make contact with the gate electrode 122 of the gate structure 118. In some embodiments, the portion 124A may have a top surface in a position higher than an interface between the p-type doped III-V compound semiconductor layer 120 and the gate electrode 122. The portion 124C can make contact with the S/D electrode 116. The portion 124C may have a top surface in a position lower than a top surface of the S/D electrode 116.

The portion 124A has a thickness less than a thickness of the portion 124B. A connection between the portions 124A and 124B has a step profile. That is, the portion 124B may have a sidewall facing the gate structure 118 and the portions 124A, such that the portions 124A and 124B can serve as a step. The portion 124B has a thickness less than a thickness of the portion 124C. A connection between the portions 124B and 124C has a step profile. The portion 124C may have a sidewall facing the gate structure 118 and the portions 124B, and thus the portions 124B and 124C can serve as a step. In some embodiments, each of the portions 124A-124C has the substantially/approximately uniform thickness. In some embodiments, the portions 124A-124C can collectively form steps which have gradually increasing heights, respectively, with respect to the nitride-based semiconductor layer 108. In other words, the strain-compensating layer 124 has the thickness increasing along the direction from the gate electrode 122 toward the S/D electrode 116.

Since the portions 124A and 124C serving two opposite ends of the strain-compensating layer 124 have the different thicknesses, the strain-compensating layer 124 may have contact regions with spanning different areas at the two opposite ends thereof. For example, the strain-compensating layer 124 can make contact with a sidewall of the doped III-V compound semiconductor layer 120 through the portion 124A and make contact with a sidewall of the S/D electrode 116 through the portion 124C. The portion 124C can extend upward along the sidewall of the S/D electrode 116 to a position higher than the portion 124A. Accordingly, a contact region between the strain-compensating layer 124 and the sidewall of the doped III-V compound semiconductor layer 120 is in a position lower than a contact region between the strain-compensating layer 124 and the sidewall of the S/D electrode 116. The contact region between the strain-compensating layer 124 and the sidewall of the doped III-V compound semiconductor layer 120 has an area less than an area of the contact region between the strain-compensating layer 124 and the sidewall of the S/D electrode 116.

The stress developed in the nitride-based semiconductor layer 108 can serve as one factor for dominating the 2DEG density of the 2DEG region 112 at the heterojunction between the nitride-based semiconductor layers 106 and 108. By forming the strain-compensating layer 124 to cover the nitride-based semiconductor layer 108, the extra 2DEG concentration induced by the external strain of the strain-compensating layer 124 can be achieved. In this regard, the strain provided from the strain-compensating layer 124 to the nitride-based semiconductor layer 108 is correlation with the thickness of the strain-compensating layer 124. For example, the strain provided from the strain-compensating layer 124 has a positive correlation with the thickness of the strain-compensating layer 124. Therefore, the thickness of the strain-compensating layer 124 has a correlation with the enhanced 2DEG concentration as well. Accordingly, the degrees of the enhancement to the 2DEG density of the 2DEG region 112 by the portions 124A-124C of the strain-compensating layer 124 are different due to the different thicknesses of the portions 124A-124C.

Figure 1C:
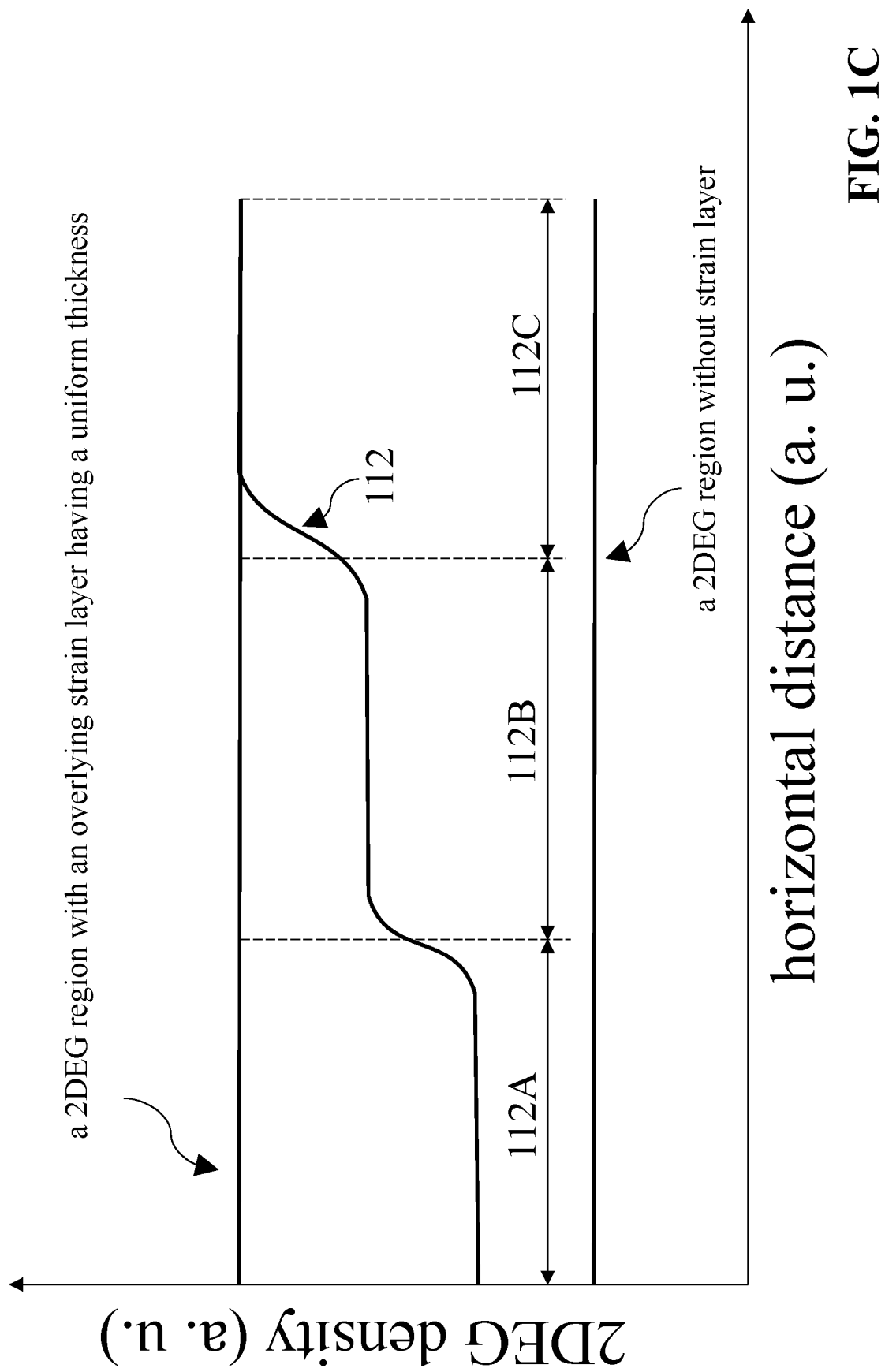
FIG. 1C depicts a graph showing a curve of a relationship between a 2DEG density and a horizontal distance of the 2DEG region.

To illustrate, FIG. 1C depicts a graph showing a curve of a relationship between a 2DEG density and a horizontal distance of the 2DEG region 112. The X axis in the graph represents the horizontal distance from the gate structure 118 to the S/D electrode 116 with arb. unit. The Y axis in the graph represents the 2DEG density with arb. unit. Further, a 2DEG region with an overlying strain layer having a uniform thickness, which is assumed to have a thickness the same as the thickness of the portion 124C, and a 2DEG region without strain layer are also depicted in FIG. 1C to serve as comparison. A 2DEG region with an overlying strain layer having a uniform thickness can have a higher 2DEG density than that of a 2DEG region without strain layer.

The 2DEG density of the 2DEG region 112 is higher than that of a 2DEG region without strain layer. The 2DEG density of the 2DEG region 112 approximately stepwise increases along the horizontal distance. The stepwise increase of the 2DEG density of the 2DEG region 112 can result from the different thicknesses of the portions 124A-124C. The 2DEG region 112 can be divided into three zones 112A, 112B, and 112C. The 2DEG density of the zone 112A is less than the 2DEG density of the zone 112B. The 2DEG density of the zone 112B is less than the 2DEG density of the zone 112C. As a result, the portions 124A-124C of the strain-compensating layer 124 can contribute a various 2DEG density of the 2DEG region 112.

Figure 2B:
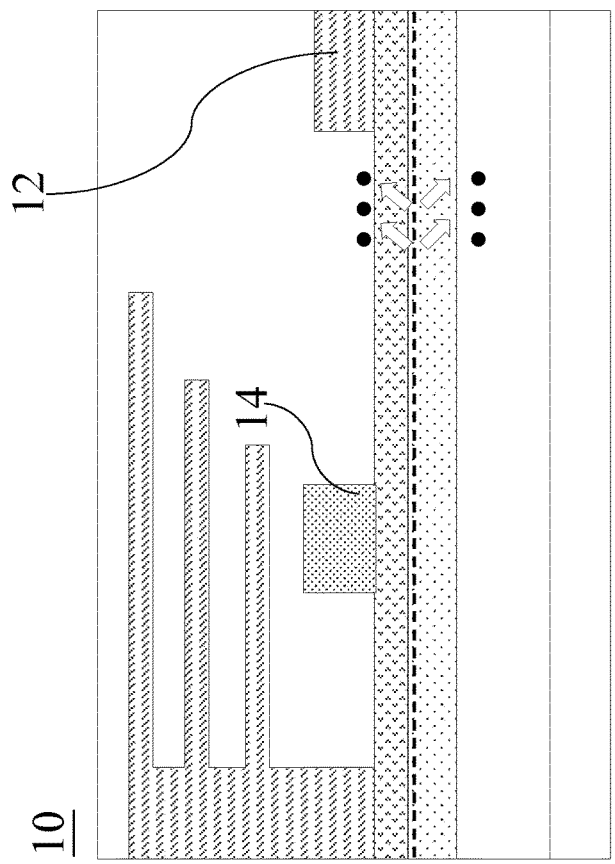
FIG. 2A depicts the semiconductor device at an off state and FIG. 2B depicts the semiconductor device at a semi-on state.
Figure 2A:
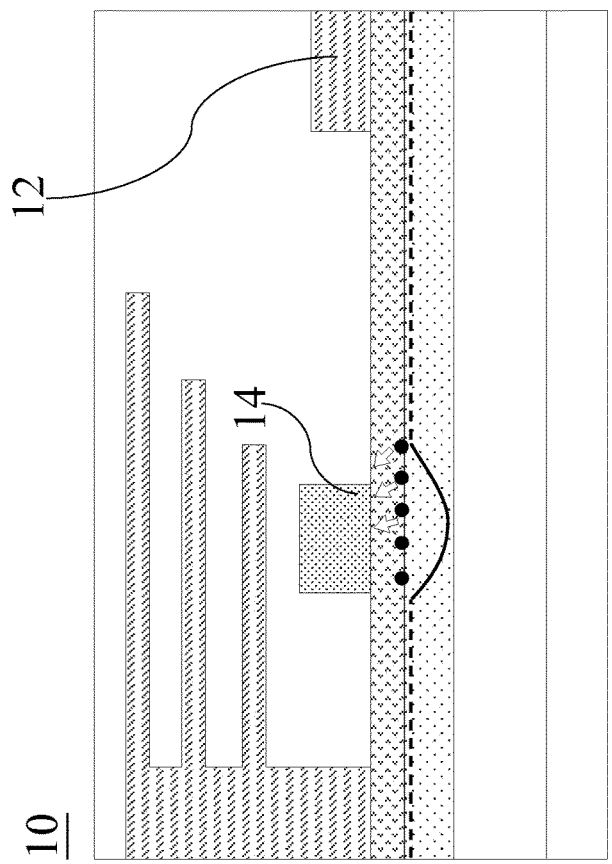

The reason for such variation in the 2DEG density of the 2DEG region 112 is to cure a breakdown issue at a drain-side gate edge and cure hot electron issue at a drain electrode. To demonstrate how these issues would decrease performance of a HEMT device, FIGS. 2A and 2B are cross-sectional views schematically showing a semiconductor device 10 according to a comparative embodiment. FIG. 2A depicts the semiconductor device 10 at an off state and FIG. 2B depicts the semiconductor device 10 at a semi-on state.

Once a 2DEG region is generated to have a higher electron density in the semiconductor device 10, the semiconductor device 10 will have a greater current density and a hot electron effect will get weaker at a drain electrode 12. However, if the semiconductor device 10 has a 2DEG region with a higher density, an electrical field at a gate structure 14 at an off state will become greater, which make a breakdown occur in the semiconductor device 10. Moreover, once a 2DEG region is generated to have a lower electron density in the semiconductor device 10, the semiconductor device 10 will have a weaker current density and a hot electron effect will get stronger at the drain electrode 12, which typically makes the performance of the semiconductor device 10 reduced. Therefore, in order to cure the breakdown and hot electron issues, a 2DEG region needs to have different electron densities at a drain-side gate edge a drain electrode, respectively.

Referring to FIGS. 1B and 1C again, the 2DEG region 112 under the strain-compensating layer 124 can have varying (i.e., increasing) 2DEG densities as afore-mentioned, so as to cure the breakdown and hot electron issues. The 2DEG region 112 can have the zone 112A with the less 2DEG density to fit the breakdown issue. The 2DEG region 112 can have the zone 112C with the greater 2DEG density to fit the hot electron issue.

The strain-compensating layer 126 can be disposed on/over/above the nitride-based semiconductor layer 108. The strain-compensating layer 124 is located between the S/D electrode 114 and the gate electrode 122 of the gate structure 118. The strain-compensating layer 126 covers the nitride-based semiconductor layer 108, so as to make contact with the top surface of the nitride-based semiconductor layer 108. The exemplary materials of each of the strain-compensating layer 126 can include, for example but are not limited to, aluminum, nitrogen, or combinations thereof. In some embodiments, the strain-compensating layer 126 is an AlN layer. In some embodiments, the strain-compensating layers 124 and 126 include the same material. In some embodiments, the strain-compensating layers 124 and 126 are made of AlN.

The strain-compensating layer 126 has a thickness more uniform than the thickness of the strain-compensating layer 124. In some embodiments, at least one part of the strain-compensating layer 124 can have the thickness different than that of the strain-compensating layer 126. For example, anyone of the portions 124A and 124B of the strain-compensating layer 124 has the thickness different than the thickness of the strain-compensating layer 126. In some embodiments, at least one part of the strain-compensating layer 124 can have the thickness the same as that of the strain-compensating layer 126. For example, each of the portions 124A and 124B of the strain-compensating layer 124 has the thickness different than the thickness of the strain-compensating layer 126. The portion 124C of the strain-compensating layer 124 can have the thickness the same as the thickness of the strain-compensating layer 126. Therefore, the 2DEG region 110 has the 2DEG density greater than the 2DEG densities of the zones 112A and 112B and approximately the same as the zone 112C of the 2DEG region 112. Furthermore, the contact region between the strain-compensating layer 124 and the sidewall of the doped III-V compound semiconductor layer 120 is in a position lower than a contact region between the strain-compensating layer 126 and another sidewall of the doped III-V compound semiconductor layer 120.

The protection layer 130 can be disposed on/over/above the strain-compensating layers 124 and 126. The protection layer 130 can cover the strain-compensating layers 124 and 126 to form interfaces I1, I2, I3, and I4, with their top surfaces. In this regard, corresponding to the strain-compensating layer 124 having the thickness increasing along the direction, vertical distances between the interfaces I1, I2, I3 and the nitride-based semiconductor layer 108 would increase along the direction pointing from the gate electrode 122 toward the S/D electrode 116.

More specifically, the vertical distance between the interface I1 and the nitride-based semiconductor layer 108 is less than the vertical distance between the interface I2 and the nitride-based semiconductor layer 108. The vertical distance between the interface I2 and the nitride-based semiconductor layer 108 is less than the vertical distance between the interface I3 and the nitride-based semiconductor layer 108. Since the portions 124A-124C can collectively form the steps having stepwise increasing heights, the increase in the vertical distances between the interfaces I1, I2, I3 and the nitride-based semiconductor layer 108 are stepwise with respect to the gate electrode 122. As the portion 124C of the strain-compensating layer 124 may have the same thickness as that of the strain-compensating layer 126, the vertical distance between the interface I3 and the nitride-based semiconductor layer 108 can be the same or approximately the same as the vertical distance between the interface I4 and the nitride-based semiconductor layer 108.

The protection layer 130 can further cover the S/D electrodes 114 and 116 and the gate structure 118. The protection layer 130 can be formed for a protection purpose, which means the protection layer 130 can be called a passivation layer as well. Accordingly, the exemplary materials of the protection layer 130 can include, for example but are not limited to, silicon, oxygen, nitrogen, or combinations thereof. In some embodiments, the exemplary materials of the protection layer 130 can include, for example but are not limited to, $SiN_x$, $SiO_x$, $Si_3N_4$, SiON, SiC, SiBN, SiCBN, or combinations thereof. In some embodiments, the protection layer 130 can be a multi-layered structure, such as a composite dielectric layer of $Al_2O_3$/SiN, $Al_2O_3$/$SiO_2$, AlN/SiN, AlN/$SiO_2$, or combinations thereof.

In some practical applications, the strain-compensating layers 124 and 126 may be too thin to be observed. Herein, the observation may include detecting a layer via scanning electronic microscope (SEM), transmission electron microscope (TEM), or other similar approaches. Accordingly, energy-dispersive X-ray spectroscopy, such as EDS, EDX, EDXS, or XEDS, can be applied to detection of existence of strain-compensating layers 124 and 126. For example, according to the material difference between the strain-compensating layer 124 and the protection layer 130, since the strain-compensating layer 124 may include Al and N but is devoid of Si and O and the protection layer includes Si and O but is devoid of Al and N, the EDS result of the strain-compensating layer 124 and the protection layer 130 can reflect where the interfaces I1, I2, and I3 are by the appearance/disappearance of targeted material. More specifically, from the nitride-based semiconductor layer 108 or the strain-compensating layer 124 to the protection layer 130, the EDS result would show Al disappears and Si or O appear at interface I1, I2, or I3. In some embodiments, from the nitride-based semiconductor layer 108 or the strain-compensating layer 124 to the protection layer 130, the EDS result would further show N disappears at interface I1, I2, or I3. Similarly, from the nitride-based semiconductor layer 108 or the strain-compensating layer 126 to the protection layer 130, the EDS result would show Al or N disappears and Si or O appear at interface I1, I2, or I3.

The passivation layers 132, 134, and 136 are disposed on the protection layer 130. The passivation layers 132 covers the protection layer 130. The passivation layers 134 covers the passivation layers 132. The passivation layers 136 covers the passivation layers 134. In some embodiments, the exemplary materials of the passivation layer 132, 134, or 136 can include, for example but are not limited to, $SiN_x$, $SiO_x$, $Si_3N_4$, SiON, SiC, SiBN, SiCBN, or combinations thereof. In some embodiments, the passivation layer 132, 134, or 136 can be a multi-layered structure, such as a composite dielectric layer of $Al_2O_3$/SiN, $Al_2O_3$/$SiO_2$, AlN/SiN, AlN/$SiO_2$, or combinations thereof. In some embodiments, no distinguishable interface/boundary exists among/between the protection layer 130, the passivation layers 132, 134, and 136, and thus they are merged. In some embodiments, at least one distinguishable interface/boundary exists among/between the protection layer 130 and the passivation layers 132, 134, and 136.

The field plates 140, 142, and 144 are disposed on/over/above the gate electrode 122 of the gate structure 118 and the strain-compensating layer 124. The field plate 140 is located between the protection layer 130 and the passivation layer 132. The field plate 142 is located between the passivation layers 132 and 134. The field plate 144 is located between the passivation layers 134 and 136. The field plates 140, 142, and 144 are configured to reshape the electric field distribution in the semiconductor device 100A and to reduce a peak value of the electric field distribution on the drain side of the gate edge. The exemplary materials of the field plates 140, 142, and 144 can include, for example but are not limited to, conductive materials, such as Ti, Ta, TiN, TaN, or combinations thereof. In some embodiments, other conductive materials such as Al, Cu doped Si, and alloys including these materials may also be used for the field plates 140, 142, and 144.

The field plates 140, 142, and 144 can be connected to the S/D electrode 114 via a conductive filling 146. The conductive filling 146 extends upward from the S/D electrode 114. The field plates 140, 142, and 144 extend laterally from the conductive filling 146 at the different heights with respect to the strain-compensating layer 126. In some embodiments, no distinguishable interface/boundary exists among/between the S/D electrode 114, the field plates 140, 142, and 144, and the conductive filling 146, and thus they are merged. In some embodiments, at least one distinguishable interface/boundary exists among/between the S/D electrode 114, the field plates 140, 142, and 144, and the conductive filling 146.

In some embodiments, the conductive filling 146 can be formed with the formation of the field plates 140, 142, and 144. For example, after the formation of the field plate 140, the bottom part of the conductive filling 146 can be formed (i.e., the parts of the conductive filling 146 over the field plate 140 are not be formed yet). Then, the passivation layer 132 is formed to cover the field plate 140 and have a trench exposing the formed conductive filling 146, and the formation of the field plate 142 is performed. After the formation of the field plate 142, the central part of the conductive filling 146 can be formed as well.

The field plates 140, 142, and 144 can have different lateral extension lengths from the conductive filling 146. The field 144 has the lateral extension length greater than the lateral extension length of the field plate 142. The field plate 142 has the lateral extension length greater than the lateral extension length of the field plate 140. Each of the lateral extension length of the field plates 140, 142, 144 is greater than a distance from the S/D electrode 114 to the gate electrode 122 of the gate structure 118, such that the field plates 140, 142, 144 be located directly above the strain-compensating layer. For example, a vertical projection of the field plate 140 on the nitride-based semiconductor layer 108 overlaps vertical projections of the gate electrode 122 and the portion 124A of the strain-compensating layer 124 on the nitride-based semiconductor layer 108. Moreover, the field plate 140 has an area overlapping with and directly above the strain-compensating layer 124; the field plate 142 has an area overlapping with and directly above the strain-compensating layer 124; the field plate 144 has an area overlapping with and directly above the strain-compensating layer 124; and the area of the field plate 144 is greater than the area of the field plate 142, and the area of the field plate 142 is greater than the area of the field plate 140. Such configuration makes the semiconductor device 100A with the strain-compensating layer 124 work smoothly.

Different stages of a method for manufacturing the semiconductor device 100A are shown in FIGS. 3A-3D, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 3A:
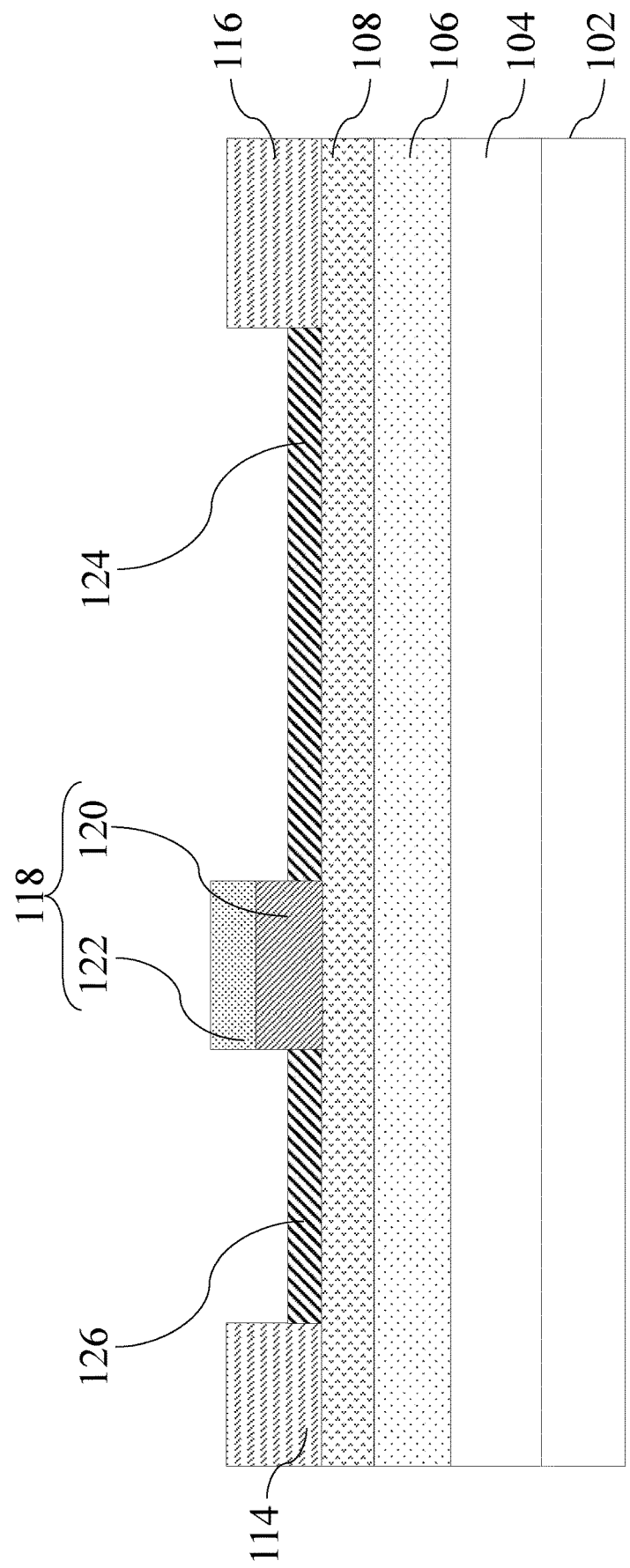
FIGS. 3A-3D show different stages of a method for manufacturing the semiconductor device according to some embodiments of the present disclosure.

Referring to FIG. 3A, a substrate 102 is provided. A buffer layer 104 and nitride-based semiconductor layers 106 and 108 can be formed over the substrate 102 in sequence by using deposition techniques. A gate structure 118 including a p-type doped III-V compound semiconductor layer 120 and a gate electrode 122 can be formed above the nitride-based semiconductor layer 108 in sequence. S/D electrodes 114 and 116 can be formed above the nitride-based semiconductor layer 108. The formation of the gate structure 118 and the S/D electrodes 114 and 116 include deposition techniques and a patterning process. The deposition techniques can be performed for forming a blanket layer, and the patterning process can be performed for removing excess portions thereof. In some embodiments, the patterning process can include photolithography, exposure and development, etching, other suitable processes, or combinations thereof. Strain-compensating layers 124 and 126 can be formed over the nitride-based semiconductor layer 108. In some embodiments, the strain-compensating layers 124 and 126 are formed by forming a blanket strain-compensating layer over the nitride-based semiconductor layer 108 using deposition techniques. The blanket strain-compensating layer may cover the S/D electrodes 114 and 116 and the gate structure 118. A patterning process can be performed for removing excess portions of the blanket strain-compensating layer, so as to define the locations of the strain-compensating layers 124 and 126.

Figure 3B:
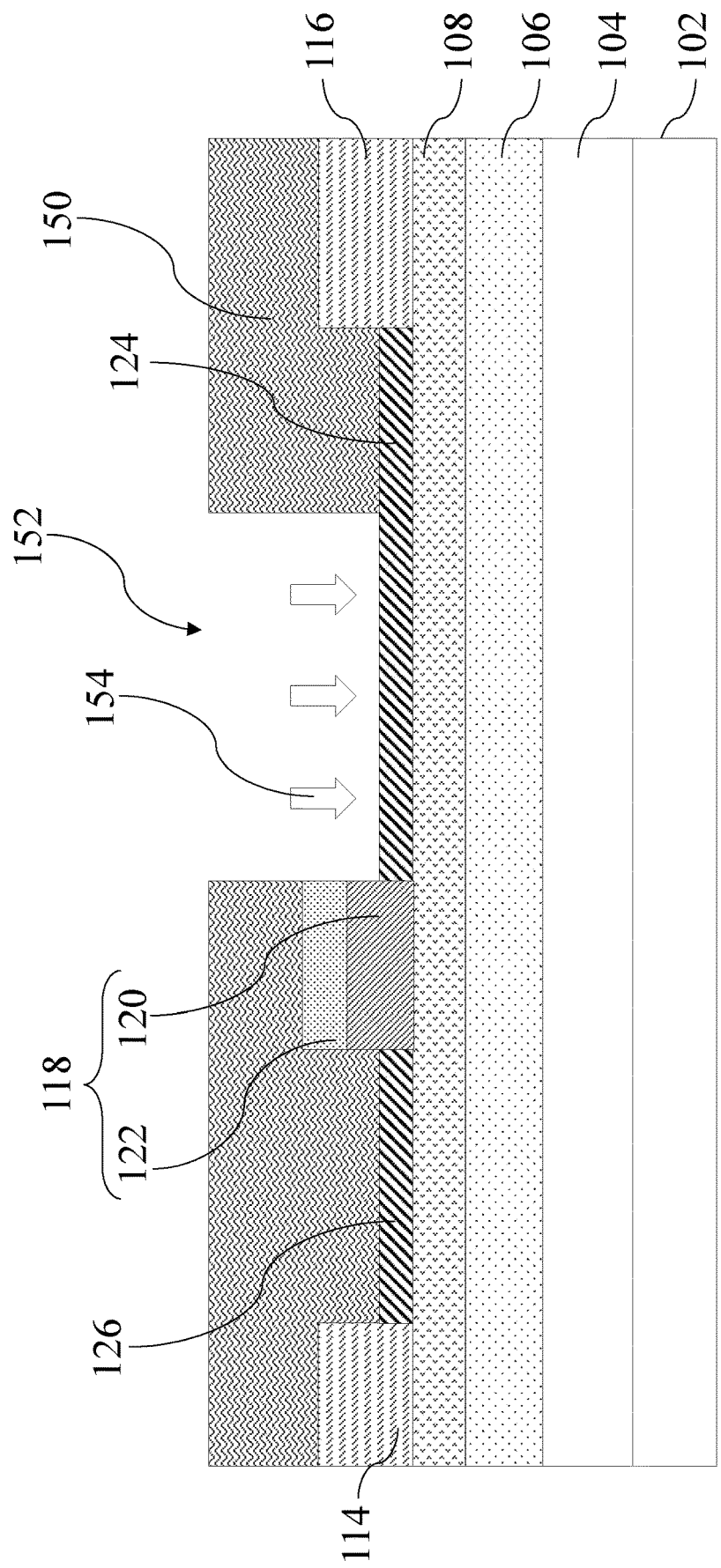

Referring to FIG. 3B, a mask layer 150 is formed above the resultant structure of FIG. 3A. The mask layer 150 can have an opening 152 to expose some portions of the strain-compensating layer 124. An etching process 154 can be performed to thin the exposed portions of the strain-compensating layer 124 such that the thickness of the exposed portions of the strain-compensating layer 124 is reduced. The etching process 154 may involve with removing some portions of the strain-compensating layer 124. The etching process 154 can include dry etching, wet etching, or combinations thereof. The thickness of the strain-compensating layer 124 or 126 covered by the mask layer 150 can be kept.

Figure 3C:
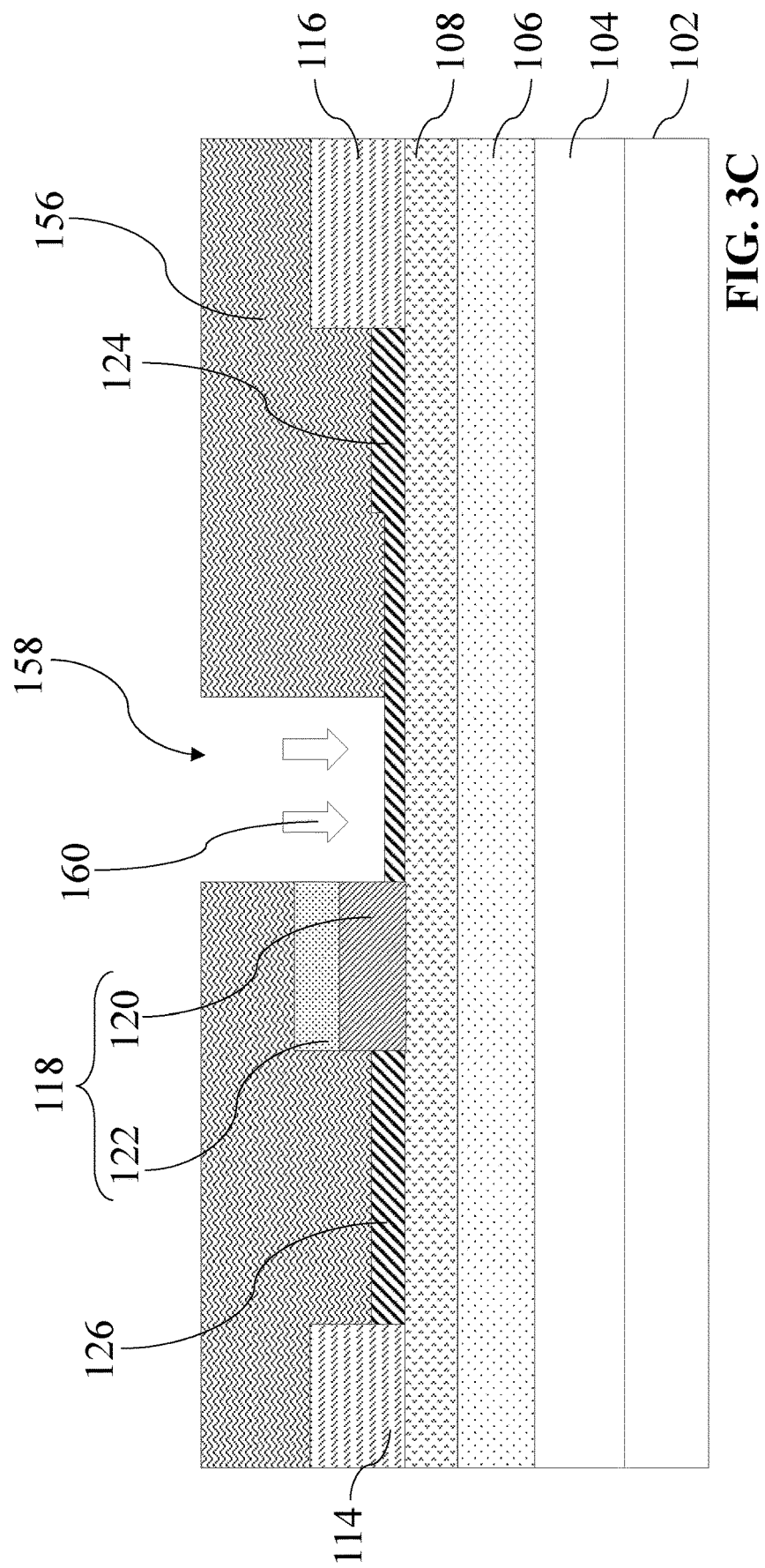

Referring to FIG. 3C, after the etching process in FIG. 3B, the mask layer 150 is removed. In this regard, after the etching process in FIG. 3B, a step appears at the strain-compensating layer 124. Another mask layer 156 is formed above the resultant structure after the mask layer 150 is removed. The mask layer 156 can have an opening 158 to expose some portions of the strain-compensating layer 124. The step of the strain-compensating layer 124 is covered by the mask layer 156. The exposed portions in FIG. 3C have an area less than that in FIG. 3B. An etching process 160 can be performed to thin the exposed portions of the strain-compensating layer 124, in which those exposed portions of the strain-compensating layer 124 have been thinned in the etching process 154 in FIG. 3B. As such, the thickness of the exposed portions of the strain-compensating layer 124 can be reduced again. The etching process 160 can include dry etching, wet etching, or combinations thereof. The thickness of the strain-compensating layer 124 or 126 covered by the mask layer 156 can be kept.

Figure 3D:
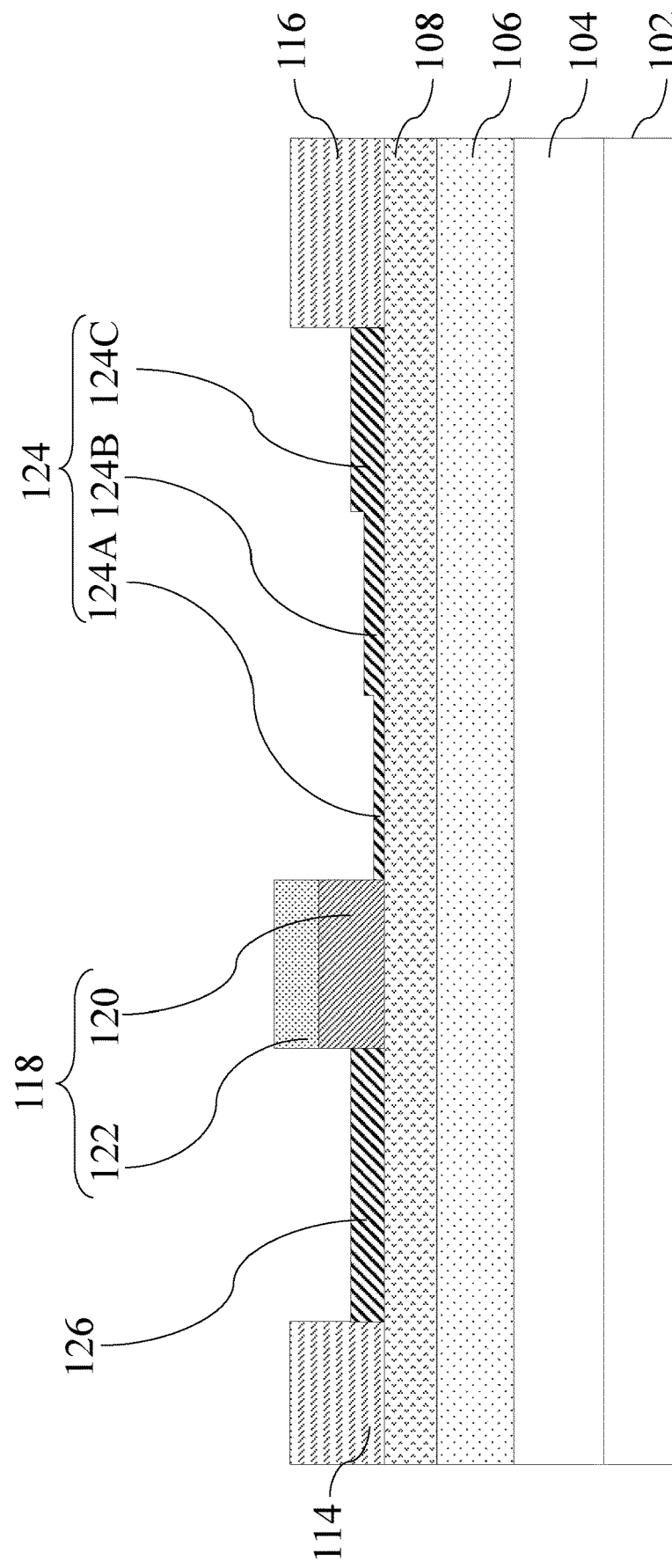

Referring to FIG. 3D, after the etching process in FIG. 3C, the mask layer 156 is removed. After the etching process in FIG. 3C, another step appears at the strain-compensating layer 124, so as to make the strain-compensating layer 124 have portions 124A-124C, as afore-described. With such profile, the strain-compensating layer 124 is formed to have a nonuniform thickness. The nonuniform thickness can result from some part of the original-formed strain-compensating layer 124 have been removed. Then, a protection layer, field plates, and passivation layers can be formed on the resultant structure of FIG. 3D. In some embodiments, a via or a patterned conductive layer can be formed in the semiconductor device 100A.

Although the process steps as described above have the etching process performed twice, the manufacturing process of the present disclosure in not limited thereto. In some embodiments, the etching process can be performed once by using a half tone mask or a gray tone mask. For example, during the process stage of FIG. 3B, the etching process can be performed using a half tone mask or a gray tone mask, such that the exposed portions of the strain-compensating layer 124 can be nonuniformly removed.

FIG. 4 is a cross-sectional view of a semiconductor device 100B according to some embodiments of the present disclosure. In the present embodiment, as shown in the exemplary illustration of FIG. 4, the strain-compensating layers 124 and 126 have edges extending upward. The doped III-V compound semiconductor layer 120 of the gate structure 118 may have opposite sidewalls SWL and SWR. The portion 124A of the strain-compensating layer 124 can have an edge extending upward along the sidewall SWR of the doped III-V compound semiconductor layer 120. The strain-compensating layer 126 can have an edge extending upward along the sidewall SWL of the doped III-V compound semiconductor layer 120.

The edges of the portion 124A of the strain-compensating layer 124 and the strain-compensating layer 126 may extend upward at different heights. Such edges may be formed by the applied process conditions. In other word, since the strain-compensating layers 124 and 126 can be formed from etching the same blanket layer, those edges are formed from the residual in the etching process. In some embodiments, the edges of the strain-compensating layers 124 and 126 may extend upward to a position higher than an interface between the doped III-V compound semiconductor layer 120 and the gate electrode 122 of the gate structure 118. Although FIG. 4 only shows the left edge of the strain-compensating layer 124 has the edge formed from the residual in the etching process, the right edge of the strain-compensating layer 124 may have the similar profile. For example, the S/D electrode 116 may have a sidewall facing the doped III-V compound semiconductor layer 120, and the portion 124C of the strain-compensating layer 124 can have an edge extending upward along the sidewall of the S/D electrode 116

Figure 5A:
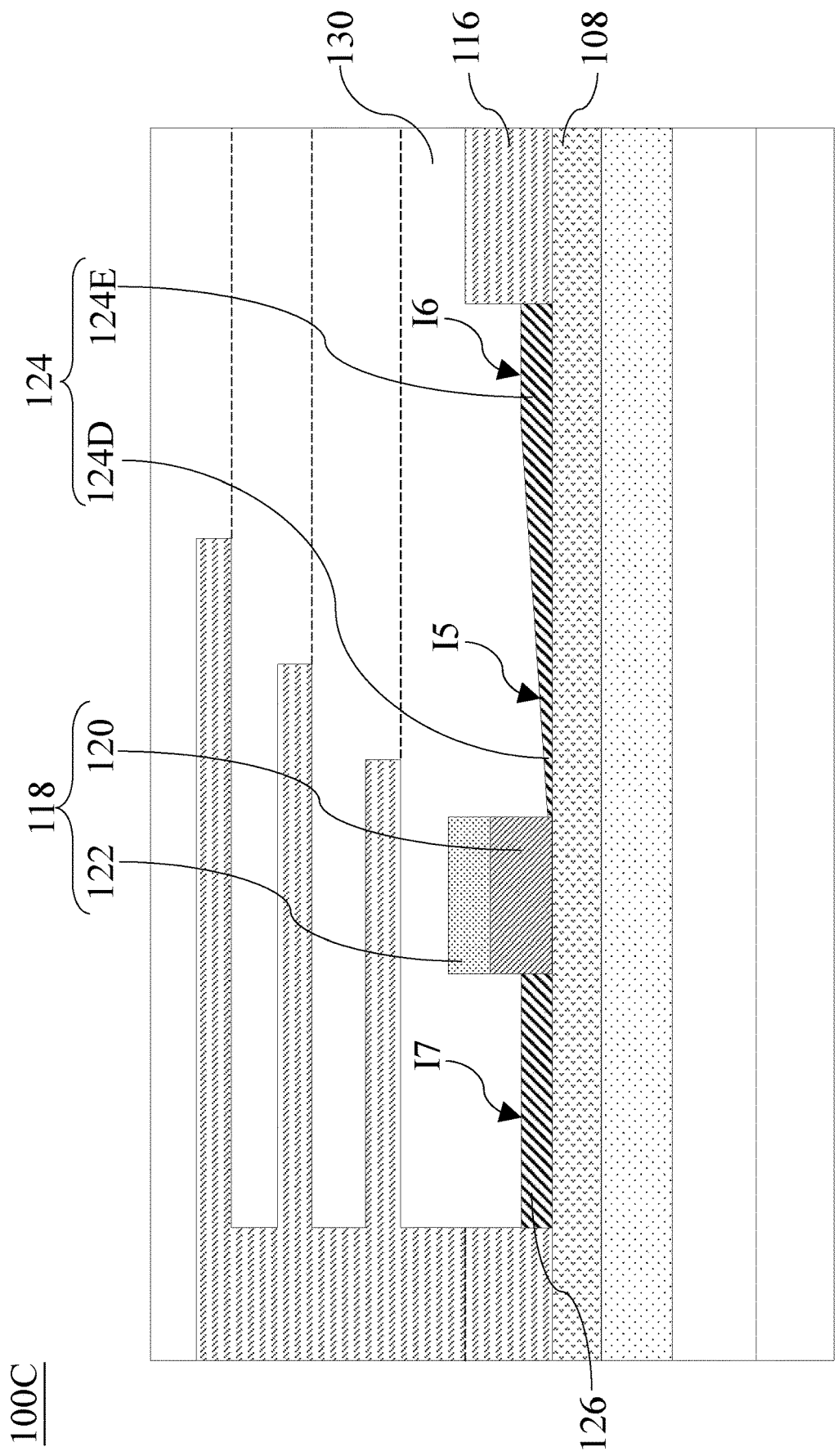
FIG. 5A is a cross-sectional view of a semiconductor device according to some embodiments of the present disclosure.

FIG. 5A is a cross-sectional view of a semiconductor device 100C according to some embodiments of the present disclosure. In the present embodiment, as shown in the exemplary illustration of FIG. 5A, the strain-compensating layer 124 has portions 124D and 124E which are arranged along the direction from the gate structure 118 toward the S/D electrode 116.

The portion 124D has a thickness gradually increasing along the direction from the gate structure 118 toward the S/D electrode 116. The increase of the thickness of the portion 124D may be linear. The portion 124D has an incline profile. The portion 124D tapers away from the portion 124E. The left edge of the portion 124D is in contact with the doped III-V compound semiconductor layer 120 of the gate structure 118, so to form a contact area therebetween. The portion 124E has a thickness more uniform than the thickness of the portion 124D. The portion 124E has a stage profile with respect to the portion 124D. The portion 124E may have the thickness the same as the maximum thickness of the portion 124D. The strain-compensating layer 126 may have the thickness the same as the maximum thickness of the portion 124D. As such, the 2DEG region 112 may have zones 112D and 112E corresponding to the portion 124D and 124E of the strain-compensating layer 124, respectively.

Figure 5B:
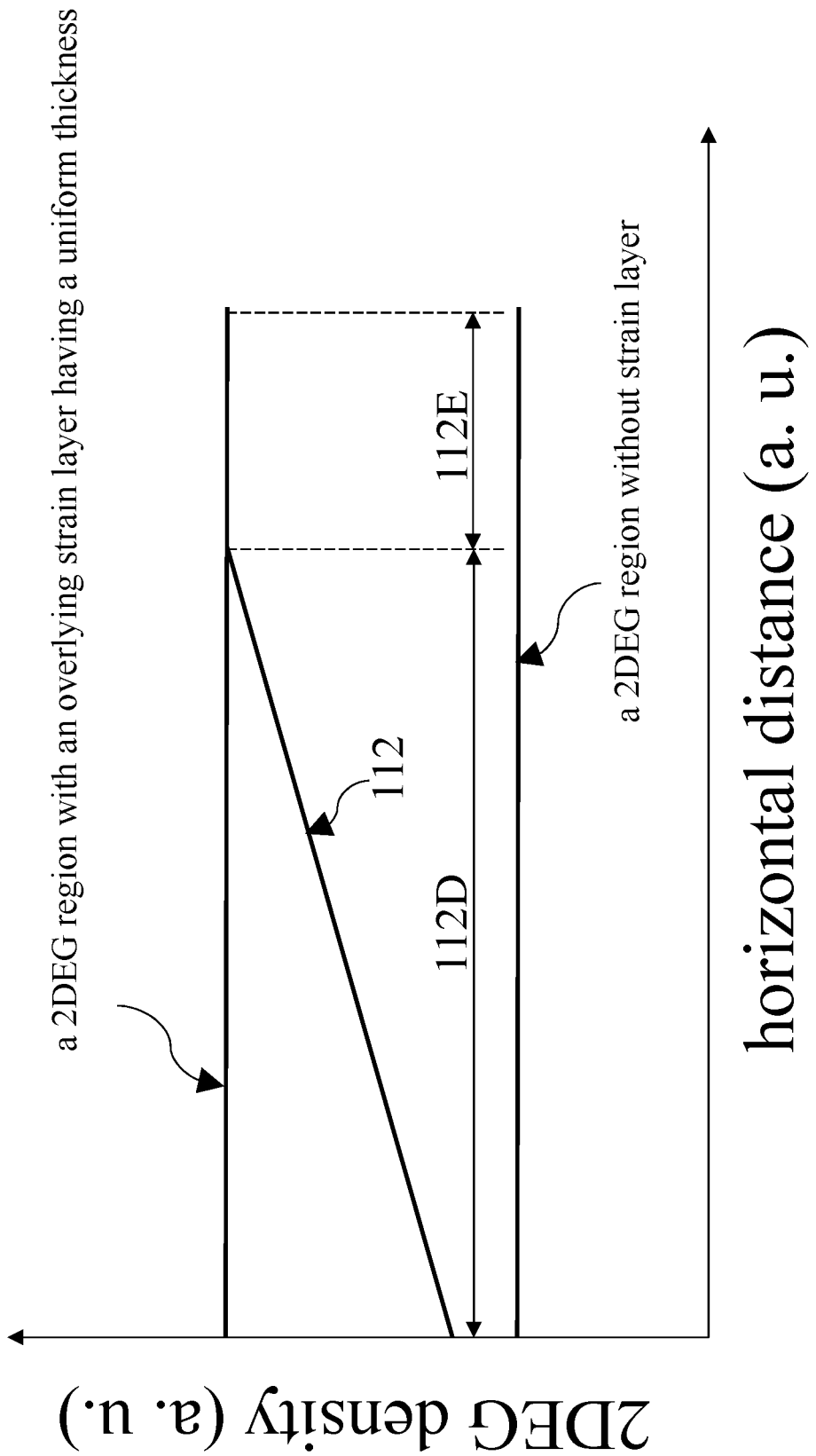
FIG. 5B depicts a graph showing a curve of a relationship between a 2DEG density and a horizontal distance of the 2DEG region of FIG. 5A.

To illustrate, FIG. 5B depicts a graph showing a curve of a relationship between a 2DEG density and a horizontal distance of the 2DEG region 112 of FIG. 5A. The X axis in the graph represents the horizontal distance from the gate structure 118 to the S/D electrode 116 with arb. unit. The Y axis in the graph represents the 2DEG density with arb. unit. Further, a 2DEG region with an overlying strain layer having a uniform thickness, which is assumed to be the same as the thickness of the portion 124E, and a 2DEG region without strain layer are also depicted in FIG. 5B to serve as comparison. A 2DEG region with an overlying strain layer having a uniform thickness can have a higher 2DEG density than that of a 2DEG region without strain layer.

The 2DEG density of the 2DEG region 112 is higher than that of a 2DEG region without strain layer. The zones 112D and 112E of the 2DEG region 112 can be enhanced by the portions 124D and 124E, respectively. The 2DEG density of the zone 112D of the 2DEG region 112 linearly increases along the horizontal distance. The maximum of the 2DEG density of the zone 112D of the 2DEG region 112 can be the same as the 2DEG density of the zone 112E. The linear increase of the 2DEG density of the zone 112D of the 2DEG region 112 can result from the thickness thereof linearly increasing. The 2DEG density of the zone 112E of the 2DEG region 112 can keep approximately constant, which result from the uniform thickness of the portion 124E. Therefore, the breakdown and hot electron issues can be cured by the distribution of the 2DEG region 112 of FIG. 5B.

The protection layer 130 can cover the strain-compensating layers 124, so as to form interfaces I5 and I6 with the portions 124D and 124E, respectively. The protection layer 130 also can cover the strain-compensating layers 126 to form an interface I7. In this regard, a vertical distance between the interface I5 and the nitride-based semiconductor layer 108 gradually increasing along the direction from the gate structure 118 toward the S/D electrode 116. The increase of the vertical distance may be linear/gradual with respect to the gate electrode 122 of the gate structure 118, such that the interface I5 is oblique. For example, with respect to the top surface of the nitride-based semiconductor layer 108, the interface I5 is oblique. Furthermore, a vertical distance between at least one part of the interface I5 and the nitride-based semiconductor layer 108 is less than a vertical distance between the interface I6 and the nitride-based semiconductor layer 108. The vertical distance between at least one part of the interface I5 and the nitride-based semiconductor layer 108 is less than a vertical distance between the interface I7 and the nitride-based semiconductor layer 108. The vertical distance between the interface I6 and the nitride-based semiconductor layer 108 is approximately the same as the vertical distance between the interface I7 and the nitride-based semiconductor layer 108.

Figure 6A:
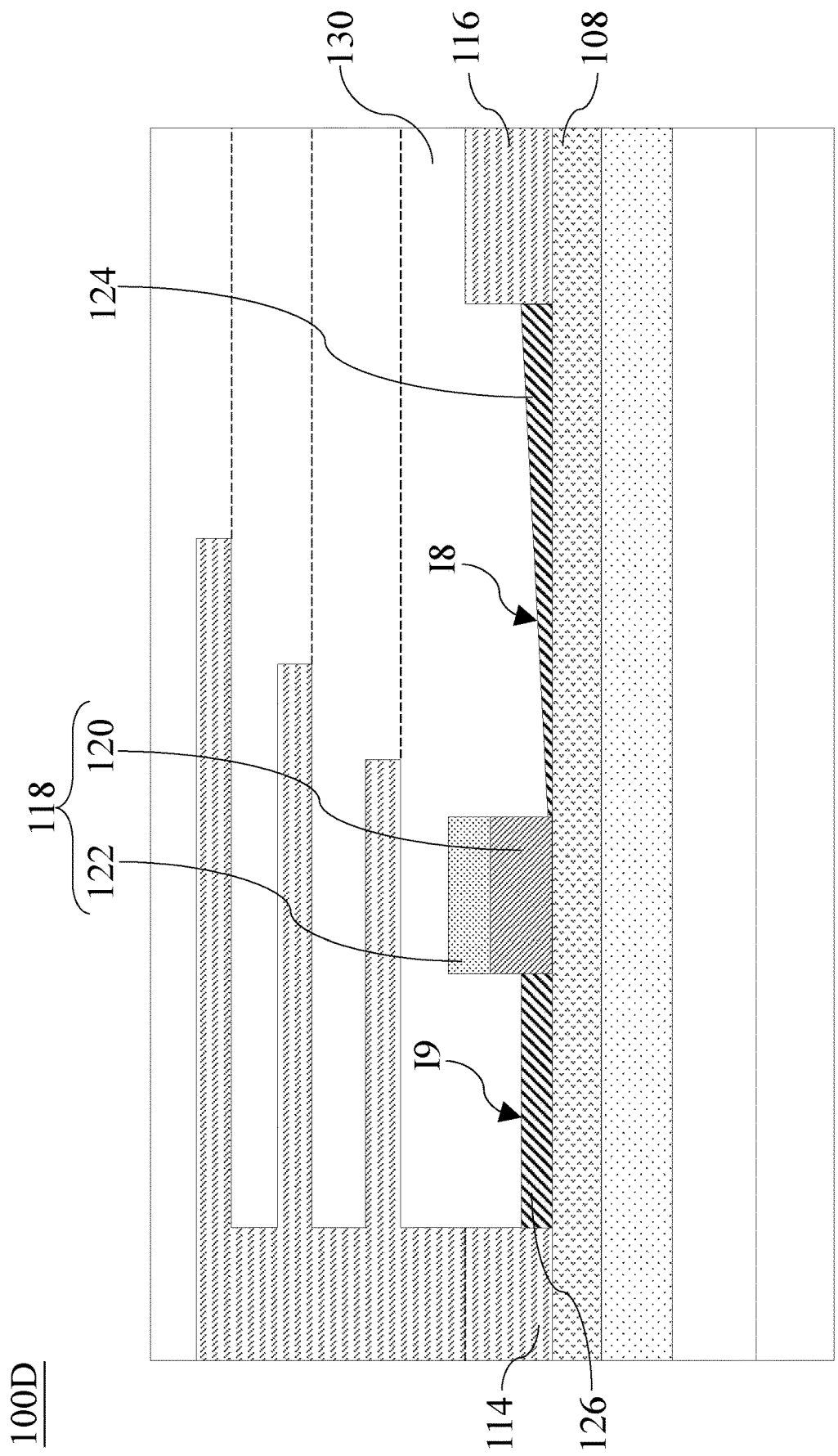
FIG. 6A is a cross-sectional view of a semiconductor device 1 according to some embodiments of the present disclosure.

FIG. 6A is a cross-sectional view of a semiconductor device 100D according to some embodiments of the present disclosure. In the present embodiment, as shown in the exemplary illustration of FIG. 6A, an entirety of the strain-compensating layer 124 has a thickness gradually/linearly increasing along the direction from the gate structure 118 toward the S/D electrode 116. The entirety of the strain-compensating layer 124 has an incline profile. The left edge of the strain-compensating layer 124 is in contact with the doped III-V compound semiconductor layer 120 of the gate structure 118, so to form a contact area therebetween. That is, no obvious flat stage appears at the strain-compensating layer 124. The strain-compensating layer 126 may have the thickness the same as the maximum thickness of the strain-compensating layer 124. As such, the 2DEG region 112 under the strain-compensating layer 124 can be linearly enhanced.

Figure 6B:
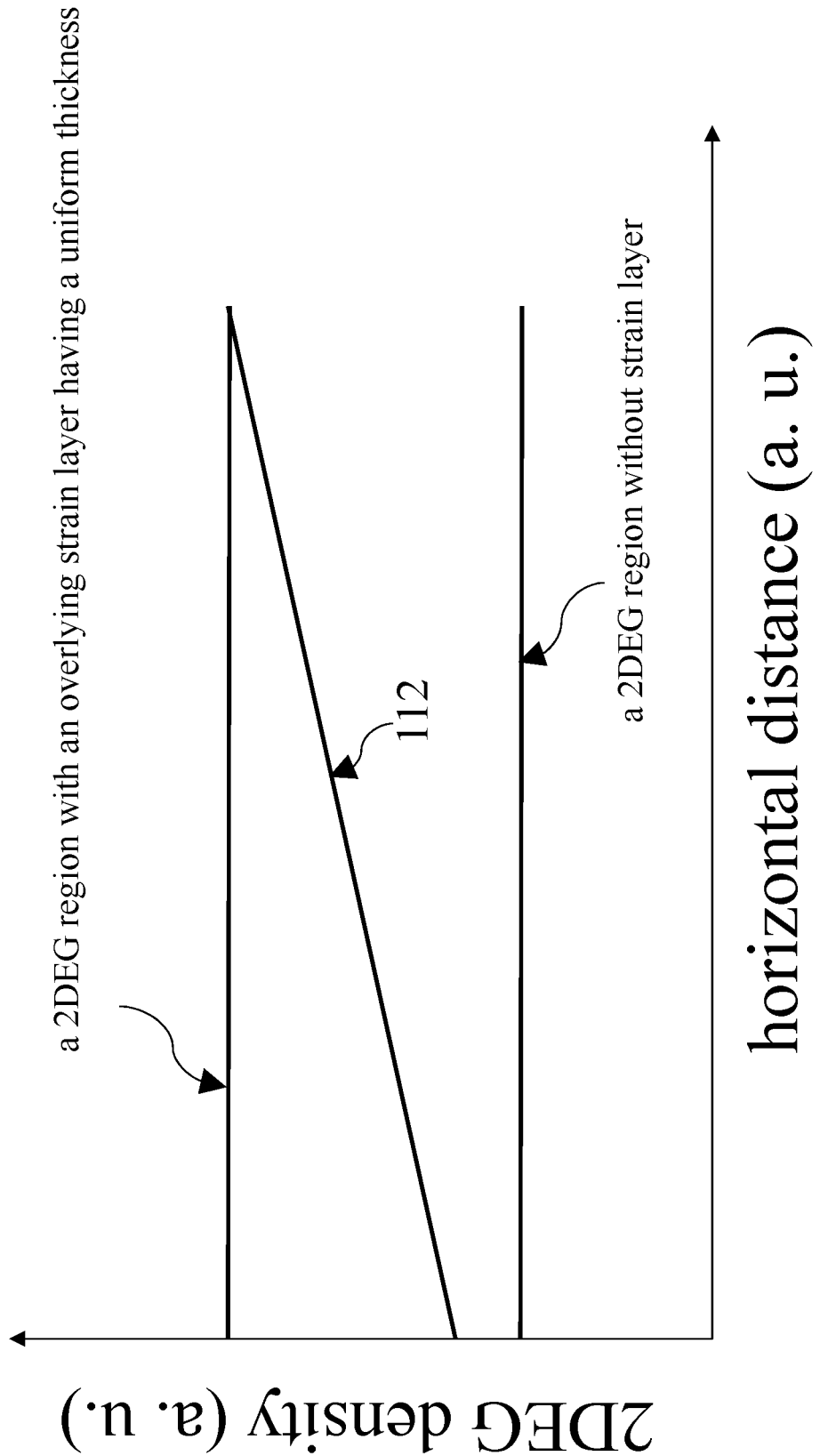
FIG. 6B depicts a graph showing a curve of a relationship between a 2DEG density and a horizontal distance of the 2DEG region of FIG. 6A.

To illustrate, FIG. 6B depicts a graph showing a curve of a relationship between a 2DEG density and a horizontal distance of the 2DEG region 112 of FIG. 6A. The X axis in the graph represents the horizontal distance from the gate structure 118 to the S/D electrode 116 with arb. unit. The Y axis in the graph represents the 2DEG density with arb. unit. Further, a 2DEG region with an overlying strain layer having a uniform thickness, which is assumed to be the same as the thickness of the portion 124E, and a 2DEG region without strain layer are also depicted in FIG. 6B to serve as comparison. A 2DEG region with an overlying strain layer having a uniform thickness can have a higher 2DEG density than that of a 2DEG region without strain layer.

The 2DEG density of the 2DEG region 112 is higher than that of a 2DEG region without strain layer. The 2DEG density of the 2DEG region 112 linearly increases along the horizontal distance. The 2DEG density of the 2DEG region 112 can reach the maximum at the end of the horizontal distance. The linear increase of the 2DEG density of the 2DEG region 112 can result from the thickness thereof linearly increasing. Therefore, the breakdown and hot electron issues can be cured by the distribution of the 2DEG region 112 of FIG. 5B.

Referring to FIG. 6A again, the protection layer 130 can cover the strain-compensating layers 124, so as to form an interfaces I8. The protection layer 130 also can cover the strain-compensating layers 126 to form an interface I9. In this regard, a vertical distance between the interface I8 and the nitride-based semiconductor layer 108 gradually increases along the direction from the gate structure 118 toward the S/D electrode 116. The increase of the vertical distance may be linear or gradual with respect to the gate electrode 122 of the gate structure 118, such that the interface I8 is oblique. For example, with respect to the top surface of the nitride-based semiconductor layer 108, the interface I8 is oblique. Furthermore, a vertical distance between at least one part of the interface I8 and the nitride-based semiconductor layer 108 is less than a vertical distance between the interface I9 and the nitride-based semiconductor layer 108.

Figure 7:
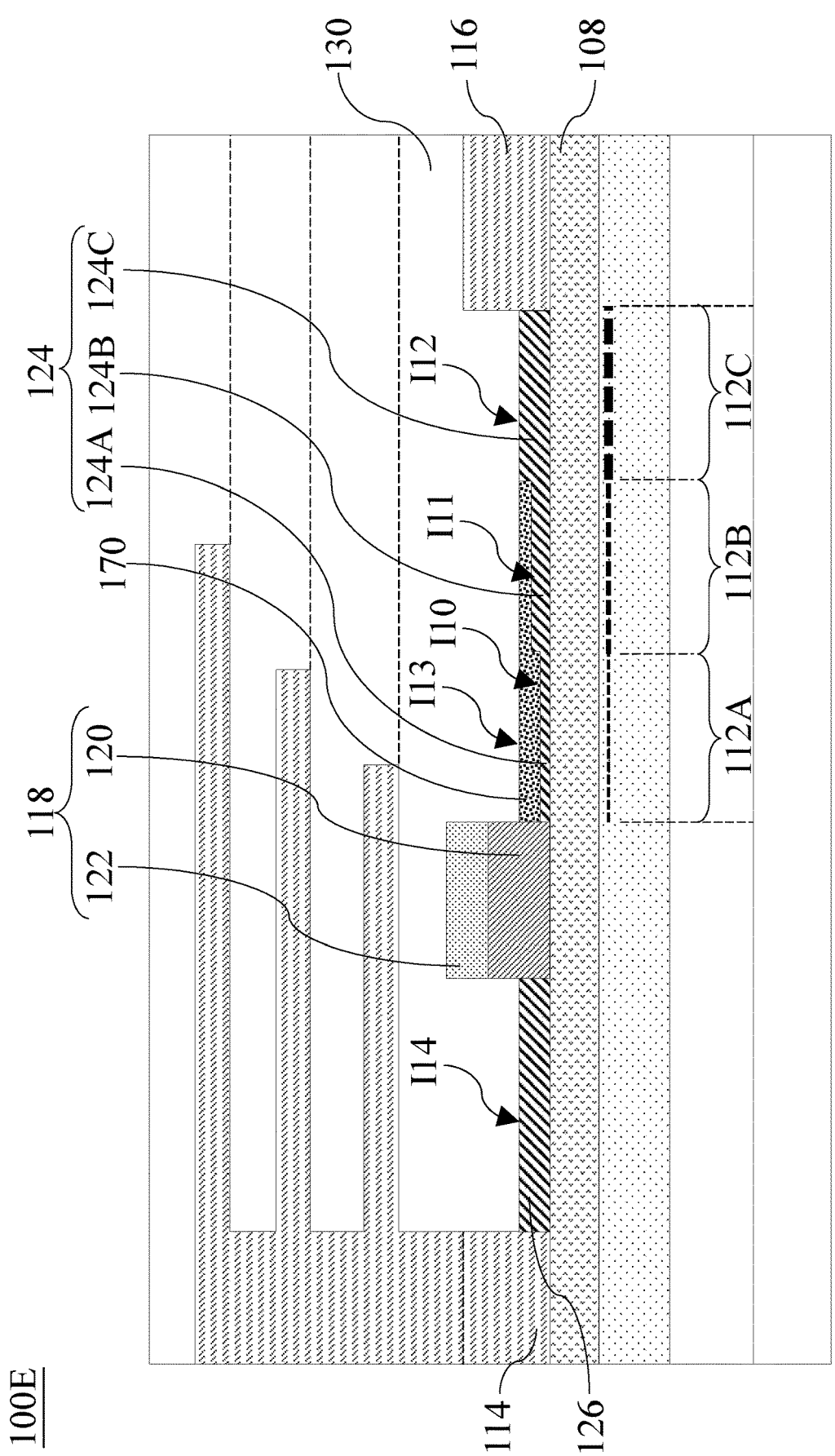
FIG. 7 is a cross-sectional view of a semiconductor device 100E according to some embodiments of the present disclosure.

FIG. 7 is a cross-sectional view of a semiconductor device 100E according to some embodiments of the present disclosure. In the present embodiment, as shown in the exemplary illustration of FIG. 7, the strain-compensating layer 124 is further covered by a protection layer 170. More specifically, the portions 124A and 124B of the strain-compensating layer 124 are covered by the protection layer 170, and the portion 124C of the strain-compensating layer 124 is covered by the protection layer 130.

The protection layers 130 and 170 may have different properties. For example, the compositions of them are different. In some embodiments, the protection layer 170 can be formed by oxidating some parts of the strain-compensating layer 124. For example, after the strain-compensating layers 124 and 126 are formed by patterning a blanket strain-compensating (e.g., FIG. 3A), at least one oxidation process is performed on the strain-compensating layer 124 such that some parts of the strain-compensating layer 124 can become the protection layer 170. That is, since some parts of the strain-compensating layer 124 can become the protection layer 170, the thickness of the original-formed strain-compensating layer 124 can be regarded as being reduced.

The protection layer 170 can form interfaces I10 and I11 with the portions 124A and 124B of the strain-compensating layer 124, respectively. In some embodiments, the oxidation process can be performed more than once (e.g., twice), so as to achieve different oxidating depths. The oxidating depth of the protection layer 170 above the portion 124A is greater than the oxidating depth of the protection layer 170 above the portion 124B. Accordingly, the interface I10 is in a position lower than the interface I11 with respect to the nitride-based semiconductor layer 108.

Due to the oxidation process, the formed protection layer 170 can have an oxide compound, such that the protection layer 170 has a low conductivity. For example, the protection layer 170 has a conductivity less than that of the gate electrode 122. Moreover, since the formed protection layer 170 has an oxide compound, the 2DEG density enhancement to the 2DEG region by the protection layer 170 is negligible relatively to the strain-compensating layer 124. Therefore, the 2DEG region 112 still can have the zones 112A, 112B, and 112C which have the different 2DEG densities resulting from the strain-compensating layer 124 as afore-mentioned.

Furthermore, the protection layer 130 covers the protection layer 170. The protection layer 130 can form an interface I12 with the strain-compensating layer 124, in which the interface I12 is in a position higher than the interface I10 and I11 with respect to the nitride-based semiconductor layer 108. The interface I12 can be formed at a position the same as an interface I13 formed between the protection layers 130 and 170. The interfaces I12 and I13 may be coplanar with each other. The interface I12 can be formed at a position the same as an interface I14 formed between the strain-compensating layer 126 and the protection layer.

As described above, the strain-compensating layer can have varying thickness, such that the 2DEG region under the strain-compensating layer can have gradually increasing 2DEG density, so as to cure the breakdown and hot electron issues, improving the performance of the GaN-based HEMT device. Moreover, the structure for it is flexible, which means the solution for solving the breakdown and hot electron issues by the present disclosure can adopt different process conditions.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
a first nitride-based semiconductor layer disposed above a substrate;
a second nitride-based semiconductor layer disposed on the first nitride-based semiconductor layer and having a bandgap greater than a bandgap of the first nitride-based semiconductor layer;
a source electrode and a drain electrode disposed above the second nitride-based semiconductor layer;
a gate electrode disposed above the second nitride-based semiconductor layer and between the source and drain electrodes;
a first strain-compensating layer disposed above the second nitride-based semiconductor layer and between the drain and gate electrodes;
a first protection layer covering the first strain-compensating layer to form a first interface, wherein a vertical distance between the first interface and the second nitride-based semiconductor layer increases along a direction pointing toward the drain electrode from the gate electrode; and
a doped III-V compound semiconductor layer disposed between the second nitride-based semiconductor layer and the gate electrode and having a sidewall, wherein the first strain-compensating layer has a first portion extending upward along the sidewall of the doped III-V compound semiconductor layer.

2. The semiconductor device of claim 1, wherein the first strain-compensating layer comprises aluminum, nitrogen, or combinations thereof and is devoid of silicon, oxygen, or combinations thereof.

3. The semiconductor device of claim 2, wherein the first protection layer comprises silicon, oxygen, or combinations thereof and is devoid of aluminum, nitrogen, or combinations.

4. The semiconductor device of claim 1, wherein the increase in the vertical distance between the first interface and the second nitride-based semiconductor layer is stepwise with respect to the gate electrode.

5. The semiconductor device of claim 1, wherein the increase in the vertical distance between the first interface and the second nitride-based semiconductor layer is gradual with respect to the gate electrode, such that the first interface is oblique.

6. The semiconductor device of claim 1, wherein the first strain-compensating layer has a first portion and a second portion between the first portion and the drain electrode, and the first portion has a thickness less than that of the second portion.

7. The semiconductor device of claim 1, wherein the first protection layer comprises an oxide compound such that the first protection layer has a conductivity less than that of the gate electrode.

8. The semiconductor device of claim 7, further comprising:
a second protection layer covering the first protection layer and the first strain-compensating layer and forming a second interface with the first strain-compensating layer, wherein the second interface is in a position higher than the first interface.

9. The semiconductor device of claim 1, further comprising:
a first field plate disposed over the gate electrode and the first strain-compensating layer, wherein a vertical projection of the first field plate on the second nitride-based semiconductor layer overlaps vertical projections of the gate electrode and the first strain-compensating layer on the second nitride-based semiconductor layer.

10. The semiconductor device of claim 1, further comprising:
   a first field plate disposed over the first strain-compensating layer and having a first area overlapping with and directly above the first strain-compensating layer; and
   a second field plate disposed over the first strain-compensating layer and having a second area overlapping with and directly above the first strain-compensating layer, wherein the second area is greater than the first area.

11. The semiconductor device of claim 1, wherein the drain electrode has a sidewall facing the doped III-V compound semiconductor layer, wherein the first strain-compensating layer has a second portion extending upward along the sidewall of the drain electrode to a position higher than a first position.

12. The semiconductor device of claim 1, further comprising:
   a second strain-compensating layer disposed above the second nitride-based semiconductor layer and between the source and gate electrodes, wherein the first protection layer covers the second strain-compensating layer to form a second interface, and a vertical distance between the second interface and the second nitride-based semiconductor layer is greater than a vertical distance between a region of the first interface and the second nitride-based semiconductor layer.

13. The semiconductor device of claim 12, wherein the first and second strain-compensating layers comprise the same material, and the region of the first interface and the second strain-compensating layer have different thickness.

14. The semiconductor device of claim 1, wherein the first strain-compensating layer has a thickness increasing along a direction from the gate electrode toward the drain electrode.

15. A method for manufacturing a semiconductor device, comprising:
   forming a first nitride-based semiconductor layer over a substrate;
   forming a second nitride-based semiconductor layer on the first nitride-based semiconductor layer;
   forming a pair of source and drain electrodes over the second nitride-based semiconductor layer;
   forming a gate electrode over the second nitride-based semiconductor layer and between the source and drain electrodes;
   forming a strain-compensating layer over the second nitride-based semiconductor layer and at least between the gate electrode and the drain electrode;
   reducing a thickness of the strain-compensating layer between the gate electrode and the drain electrode such that the thickness of the strain-compensating layer is nonuniform; and
   forming a passivation layer to cover the strain-compensating layer having the nonuniform thickness;
   wherein reducing the thickness of the strain-compensating layer comprises:
      oxidizing a portion of the strain-compensating layer between the gate electrode and the drain electrode such that at least one remained portion of the strain-compensating layer has the reduced thickness.

* * * * *